United States Patent [19]

Rossi et al.

[11] Patent Number: 4,914,316
[45] Date of Patent: Apr. 3, 1990

[54] CIRCUIT FOR HOLDING A MOS TRANSISTOR IN A CONDUCTION STATE IN A VOLTAGE SUPPLY OUTAGE SITUATION

[75] Inventors: Domenico Rossi, Pavia; Giovanni Pietrobon, Treviso; Sandro Storti; Carlo Cini, both of Milan, all of Italy

[73] Assignee: SGS-Thomson Microelectronics S.r.l., Milan, Italy

[21] Appl. No.: 283,232

[22] Filed: Dec. 12, 1988

[30] Foreign Application Priority Data

Dec. 22, 1987 [IT] Italy .................. 23162 A/87

[51] Int. Cl.$^4$ .................. H03K 17/56; H03K 3/01
[52] U.S. Cl. .................. 307/246; 307/296.1; 307/296.4; 307/571; 365/229
[58] Field of Search .................. 307/296.1, 296.4, 96, 307/126, 571, 246, 103, 64; 365/228, 229

[56] References Cited

U.S. PATENT DOCUMENTS

| | | | |
|---|---|---|---|
| 3,700,968 | 10/1972 | Spies .................. | 307/246 |
| 4,143,286 | 3/1979 | Koike et al. .................. | 307/296.4 |
| 4,317,056 | 2/1982 | Alberts .................. | 307/296.1 |
| 4,322,634 | 3/1982 | Kaire et al. .................. | 307/296.1 |
| 4,663,547 | 5/1987 | Baliga et al. .................. | 307/571 |

Primary Examiner—Andrew J. James
Assistant Examiner—Richard Roseen
Attorney, Agent, or Firm—Rosen, Dainow & Jacobs

[57] ABSTRACT

A circuit for holding a MOS power transistor in a conduction state on the occurrence of an outage in the voltage supply, being of a type which comprises a first MOS transistor having its source connected to a line of the voltage supply and its drain connected to the gate of the power transistor, further comprises a diode connected between the drain of the first transistor and the gate of the power transistor, and a second transistor of the MOS type having its gate connected to the gate of the first transistor drain connected to the gate of the power transistor. The circuit prevents the gate capacitance of the power transistor from becoming discharged on a failure of the voltage supply, thus holding that transistor in a conducting state.

2 Claims, 1 Drawing Sheet

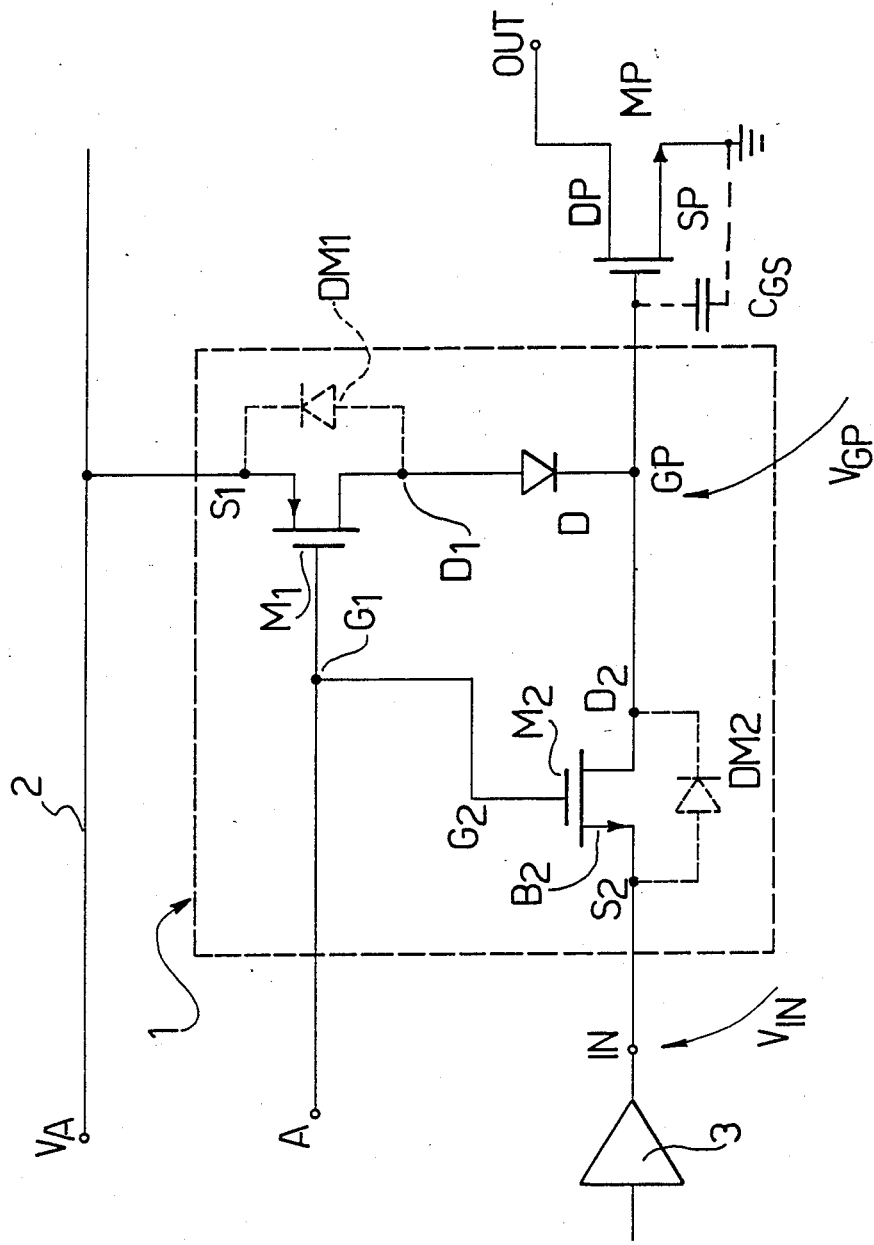

CIRCUIT FOR HOLDING A MOS TRANSISTOR IN A CONDUCTION STATE IN A VOLTAGE SUPPLY OUTAGE SITUATION

DESCRIPTION

This invention relates to a circuit for holding a MOS transistor, in particular a power transistor, in a conduction state on the occurrence of an outage in the voltage supply, being of a type which comprises a first N-channel MOS transistor having its source terminal connected to a line of said voltage supply and its drain terminal connected to the gate of said power transistor.

As is known, MOS power transistors are widely employed to connect and control electric loads, in particular electric motors.

Should a drop off occur in the voltage supply, the phases of the electric motor must be connected to ground by closing switches. Such switches may comprise the above-noted MOS power transistors which, in order to operate as closed switches, are to be held in a conducting state even if the electric power supply has failed.

To meet that demand, the prior art has proposed a circuit arrangement as described below.

Each power transistor is connected to a make circuit which comprises a MOS transistor having its source terminal connected to an electric supply line via a diode, and its drain terminal connected to the gate of the power transistor. The gate terminal of that MOS transistor is intended to receive a make signal for the power transistor, which transistor receives, in turn, at its gate terminal a signal from the output of a so-clled driver.

Also provided in the make circuit described above is a large capacitance connected between the source of the MOS transistor of the make circuit and ground. This capacitance makes up for current leakage from the make circuit on the occurrence of a drop-off in the electric supply, as well as for current leakage from the driver which, when receiving no power, behaves at its output as a circuit shorting out to ground.

This prior technical approach, while substantially achieving its objective, has the serious drawback that the value of said capacitance must be high, thereby its incorporation in the integrated circuit forming the make circuit is unthinkable, on account of enhanced costs and space requirements.

The technical problem that underlies this invention is to provide a circuit which has such design and performance characteristics as to allow of a MOS power transistor to be held in a conducting state on a failure of the electric power supply to thereby obviate the drawback with which the prior art is beset.

This problem is solved by a circuit of the kind specified hereinabove being characterized in that it comprises a diode connected between the drain of the first transistor and the gate of the power transistor, and a second transistor of the MOS type having its gate connected to the gate of the first transistor and its drain connected to the gate of the power transistor.

The features and advantages of a circuit according to the invention will be more clearly apparent from the following detailed description of an embodiment thereof, to be taken by way of illustration only in conjunction with the accompanying drawing.

The drawing shows a schematical view of a holding circuit according to this invention.

With reference to the drawing, the numeral 1 comprehensively and schematically designates a circuit for holding a field-effect power transistor MP of the MOS (Metal-Oxide Semiconductor) type in a conduction state on the occurrence of a power outage.

That transistor MP is of the n-channel type and conventionally includes a source terminal SP connected to ground, and a drain terminal DP which forms an output terminal OUT for the circuit 1 and is intended for connection to an external load, such as an electric motor not shown because it is of conventional design.

The power transistor MP further includes a gate terminal GP having an inherent gate capacitance CGS.

The circuit 1 is connected to an electric power supply line 2, which is in turn connected to a positive supply poly VA.

More particularly, the circuit 1 comprises a first transistor M1 of the p-channel MOS type having its source terminal S1 connected to the line 2, and its drain terminal D1 connected to the gate GP of the transistor MP via a diode D.

The transistor M1 further includes an intrinsic diode DM1 connected between the drain D1 and the source S1, as well as a gate terminal C1 connected to an input terminal A of the circuit 1 and is intended for receiving signal commanding the make state of the transistor MP.

Advantageously, it is also contemplated that a second transistor M2 of the n-channel MOS type be arranged to have its gate terminal G2 connected to the gate G1 of the transistor M1 and its drain terminal D2 connected to the gate GP of the power transistor MP.

That second transistor M2 also has the source S2 and substrate B2 terminals connected to each other and and to an input terminal IN which is connected to the output of a driver circuit 3 external of the circuit 1 and operative to drive the transistor MP.

The transistor M2 is in turn provided with an intrinsic diode DM2 connected between the source S2 and drain D2 terminals; in addition, the transistor M2 should be sized to have a negligible series resistance compared to the series resistance of the driver 3.

The circuit 1 of this invention operates as follows.

Assuming in operation a starting condition whereby power is supplied on line 2, there may occur either of two cases.

CASE 1

The voltage V at the input terminal A is equal to the supply voltage VA (V=VA). It follows that the voltage drop VGS between the gate and the source of the transistor M1 will be 0 Volts, and accordingly that transistor will be in an off state. The transistor M2 is instead conducting if the supply voltage VA is higher than the voltage VIN at the input terminal IN for the threshold voltage VTH2 of the transistor M2. Even if the threshold voltage VTH2 is greater than a diode voltage drop, the driver 3 would drive the gate GP of the transistor MP and all the output voltage VIN delivered to that gate less the voltage drop across the intrinsic diode DM2.

CASE 2

The voltage V at the terminal A is zero (V=0 Volts), the trnasistor M1 is conducting and, though the diode D, charges the gate capacitor of the transistor MP, thereby the latter will be in turn conducting.

At the same time, the transistor M2 is in an off state in that there is a positive or zero VIN at the source and zero voltage at the gate G2.

Now, a third possible operational case presents itself.

CASE 3

This is the case in which there is no supply voltage on the line 2 (VA=0), and the voltage V is also zero at the terminal A.

Inasmuch as that operating condition follows in time the Case 2 just discussed, the gate capacitor of the transistor MP will be charged, and that transistor keep conducting.

The transistor M2 is still in a non-conducting state, and the transistor M1 could provide a route for discharging the capacitor CGS of the power transistor through the diode DM1. Actually, since the voltage VA is lower than the voltage VGP at the gate of the transistor MP, the diode D would be reverse biased and inhibit discharge of the gate capacitor of the power transistor MP.

To summarize, the diode D isolates the current leakout through transistor M1, having the intrinsic diode DM1, and transistor M2 is off and isolates the driver 3 from the gate capacitor of the power transistor. Accordingly, on the occurrence of the supply voltage VA drop, the gate of the power transistor is automatically isolated from all the components of the circuit 1, and holds that transistor in a permanently conducting state.

The circuit of this invention solves, therefore, the technical problem and affords a number of advantages, an outstanding one being that the very inherent gate capacitance of the power transistor is utilized to hold it in conduction on the occurrence of a drop in the voltage supply.

The circuit of this invention is made up of an unusually few number of components, and makes provisions unnecessary to cancel leakage currents of the drivers in the absence of power supply.

The circuit can be driven, in the absence of power supply, in an extremely simple way, since the input impedance of the make terminal A is almost infinite and it receives under that condition a signal having a low logic value.

We claim:

1. A circuit for holding a MOS power transistor in a conduction state on the occurrence of an outage in the voltage supply, comprising a first MOS transistor, a diode and a second MOS transistor, said first MOS transistor having its source coupled to a line of said voltage supply, said diode coupling a drain of said first transistor to a gate of said power transistor, said second transistor having its gate coupled to a gate of said first transistor and its drain coupled to said gate of said power transistor.

2. The circuit according to claim 1 wherein said first transistor is an n-channel MOS transistor and said second transistor is a p-channel MOS transistor, said diode having its anode coupled to said drain of said first transistor and its cathode coupled to said gate of said power transistor.

* * * * *